United States Patent [19]

Shinohara

[11] 4,380,211
[45] Apr. 19, 1983

[54] VACUUM EVAPORATION SYSTEM FOR DEPOSITION OF THIN FILMS

[75] Inventor: Koichi Shinohara, Kobe, Japan

[73] Assignee: Matsushita Electric Industrial Co., Ltd., Osaka, Japan

[21] Appl. No.: 299,188

[22] Filed: Sep. 3, 1981

[30] Foreign Application Priority Data

Sep. 17, 1980 [JP] Japan .................................. 55-129737

[51] Int. Cl.³ .............................................. C23C 13/10
[52] U.S. Cl. .................................... 118/718; 118/715; 118/730; 55/385 R; 204/298
[58] Field of Search ................. 118/715, 718, DIG. 7, 118/50, 719, 722, 726, 729, 730; 98/115 SB; 141/65; 55/385 A, 385 R, DIG. 1, DIG 8; 204/298; 427/251

[56] References Cited

U.S. PATENT DOCUMENTS

| 2,332,309 | 10/1943 | Drummond | 118/718 |
| 3,368,523 | 2/1968 | Becker | 118/715 |
| 4,205,623 | 6/1980 | Mahl | 118/715 |
| 4,223,048 | 9/1980 | Engle, Jr. | 427/255.3 X |
| 4,228,004 | 10/1980 | Foster | 118/715 |

OTHER PUBLICATIONS

Chern, "Improved Design for CVD Reactor", *Insulation/Circuits*, vol. 26, No. 12, Nov. 1980, pp. 62–63.

Primary Examiner—John D. Smith
Assistant Examiner—Bernard F. Plantz
Attorney, Agent, or Firm—Burgess, Ryan and Wayne

[57] ABSTRACT

A blower and a dust collector are communicated through valves with an evacuated process chamber in which are disposed one or more sets of a film-substrate holder and an evaporation source in such a way that the blower, the dust collector and the process chamber constitute a closed circuit.

4 Claims, 2 Drawing Figures

VACUUM EVAPORATION SYSTEM FOR DEPOSITION OF THIN FILMS

BACKGROUND OF THE INVENTION

The present invention relates to a vacuum evaporation system for the deposition of thin films.

For the physical deposition of thin films by the vacuum evaporation or sputtering technique, small-sized batch processes or large-sized continuous processes are employed depending upon desired objects. It is well known in the art that when a sputtering system for the fabrication of semiconductor elements with a higher packing density is disposed in a clean room of the order of Class 1000, separation of thin films on a microscopic scale due to foreign matter can be avoided, but such system can be employed only in an extremely small size.

In the vacuum evaporation or sputtering process, part of evaporated materials are deposited not on a film substrate but on the parts of the system. In the case of the continuous process, the accumulation of evaporants on parts of the system cannot be neglected. As deposition steps are repeated, the a number of times quantity of dust increases in the process atmosphere. Therefore, even if the process system is disposed within a clean room, dropouts of dust particles on video tapes or video disks cannot be decreased below a desired level in practice, the number of dust particles being one of the parameters affecting the characteristics of the tapes or disks.

SUMMARY OF THE INVENTION

The primary object of the present invention is, therefore, to provide a vacuum evaporation or sputtering system for the deposition of thin films which can substantially reduce microscopic surface flaws of deposited thin films due to inclusion of dusts or the like during the mass-productionscale physical thin-film deposition process.

Briefly stated, according to the present invention, a blower and a dust collector are communicated through valves with an evacuated process chamber in which are disposed one or more sets of a film-substrate holder and an evaporation source in such a way that the blower, the dust collector and the process chamber constitute a closed circuit.

According to the present invention, thin films which are extremely reliable and dependable in electrical characteristics can be prepared on substrates.

DESCRIPTION OF THE PREFERRED EMBODIMENTS

The present invention is based on the observed fact that the removal of dust from an evacuated process chamber is very effective in improving product quality in the vacuum evaporation or sputtering process.

Figure 1:
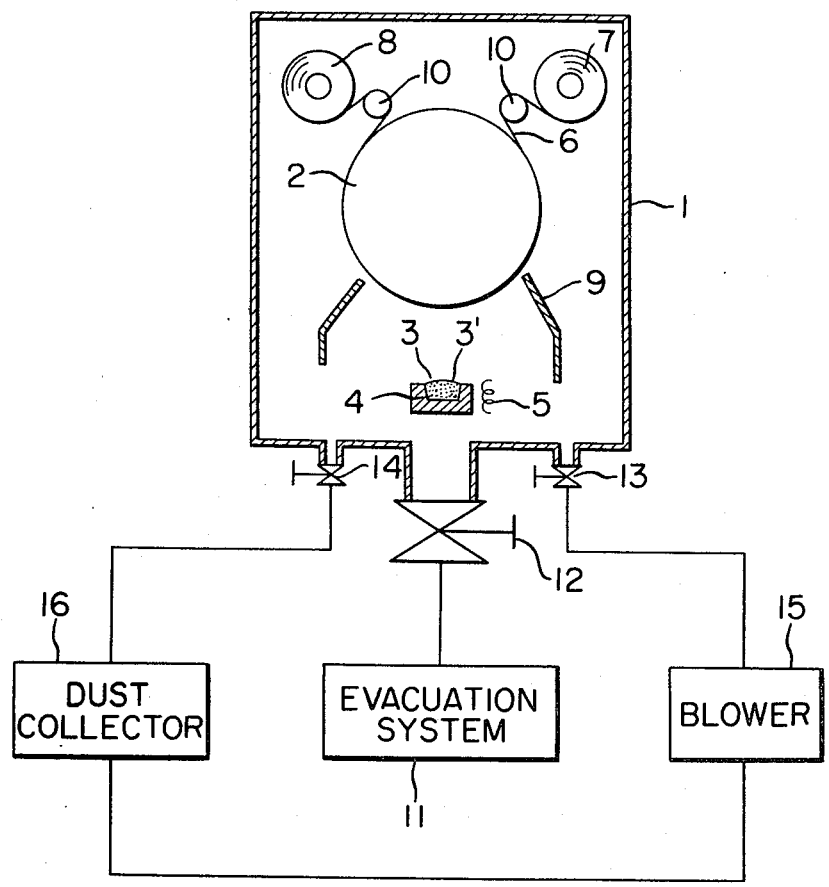
FIGS. 1 and 2 are schematic cross sections, respectively, of a first and a second embodiments of the present invention.

First Embodiment, FIG. 1

FIG. 1 shows a first embodiment of the present invention applied to a vacuum-evaporation apparatus for the deposition of film over the surface of a rolled substrate. In an evacuated process chamber 1 a deposition drum 2 and an evaporation source 3 are disposed in opposed relationship. The evaporation source 3 is of the electron-beam type. The electron beam from an electron gun 5 is directed to the surface of the evaporant material 3' charged in a water-cooled copper hearth or crucible 4 to heat and evaporate the material 3'. A substrate 6 made of plastic film is unrolled from a supply reel 7, partially wrapped around the drum 2 and rolled on a take-up reel 8. Reference numeral 9 denotes baffle plates; and 10, rollers made of a metal or alloy. The process chamber 1 is evacuated by an evacuation system 11. Reference numeral 12 denotes a valve. The process chamber 1 is communicated through valves 13 and 14 with a blower 15 and a dust collector 16 which is communicated with the blower 15. Thus, the process chamber 1, the blower 15 and the dust collector 16 constitute a closed circuit.

The advantages of the first embodiment can be much enhanced when it is located in a dust-free room.

In the first embodiment, the process chamber 1 has the volume of 5 m$^3$; the drum 2 is 800 mm in diameter; the substrate 6 is 500 mm in width; the evaporation source 3 is of the electron-beam type as described previously; and the evacuation system 11 comprises a diffusion pump with the capacity of 37 m$^3$/sec backed up with a mechanical pump and a rotary pump. The blower 15 has the discharge rate of 20 m$^3$/min and its location and the diameter of its discharge port are selected suitably. In the experiments conducted by the inventor, the dust collector is a bag filter with or without an electrical precipitator.

In general, if the process chamber 1 is of six walls or box-shaped, one wall is removable, but according to the present invention, the most effective results can be achieved when the closed system comprising the process chamber 1, the blower 15 and the dust collector 16 is made air-tight. The same is true when the process chamber 1 is in the form of a cylindrical tank.

The time required for attaining the effects of the present invention varies depending upon the flow rate and static pressure of the air circulated. In general, five to ten minutes suffice. It is apparent that the evaporator must be so designed that its interior can be made as simple as possible. It is also important that the baffle plates are so designed that the air is directed in the desired directions. In the fabrication of magnetic tapes, most effective results can be achieved when the wind is directed toward the surface of the drum 2 and the drum 2 is rotated in the direction opposite to the wind. These conditions can be selected by the arrangement of the vacuum evaporation system and desired objects.

The selection and arrangement of means required for replacing the circulating air with a gas supplied from a cylinder or an instrument for detecting the purity of the circulating air are within the scope of the present invention.

Figure 2:
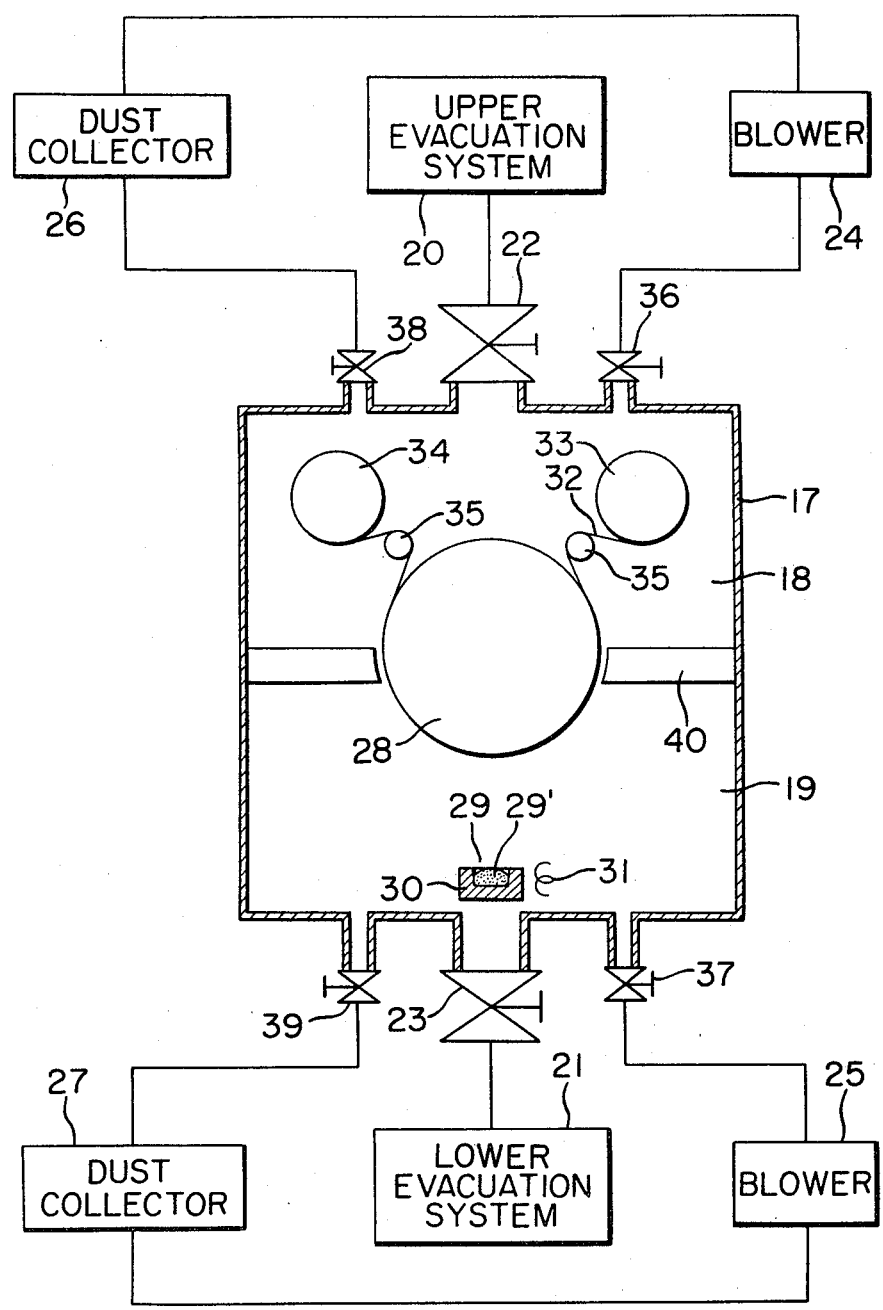

Second Embodiment, FIG. 2

FIG. 2 shows a second embodiment of the present invention. An evacuated process chamber 17 is divided into an upper chamber 18 and a lower chamber 19. The upper chamber 18 communicates through a valve 22 with an upper evacuation system 20 while the lower chamber 19 communicates through a valve 23 with a lower evacuation system 21. As with the first embodiment, the upper chamber 17 communicates through a valve 36 with a blower 24 and through a valve 38 with a dust collector 26 which in turn communicates with the blower 24. Thus, the upper chamber 17, the blower 24 and the dust collector 26 constitute a closed circuit. In like manner, the lower chamber 19 communicates through a valve 37 with a blower 25 and through a valve 39 with a dust collector 27 which in turn communicates with the blower 25. Thus, the lower chamber 19, the blower 25 and the dust collector 27 constitute a closed circuit.

Reference numeral 28 denotes a deposition drum; 29, an evaporation source; 29', an evaporant material; 30, a water-cooled copper hearth or crucible; 31, an electron gun; 32, a substrate; 33 and 34, a supply and a take-up reel, respectively; 35, rollers; and 40, partition wall which cooperates with the drum 28 in such a way that the pressure difference between the upper and lower chambers 18 and 19 can be maintained at a desired level.

The upper and lower chambers 18 and 19 have the volumes of 3 m$^3$ and 2 m$^3$, respectively, and the blowers 24 and 25 have the capacities of 15 m$^3$/min and 10 m$^3$/min, respectively. The dust collectors 26 and 27 are of the bag filter type with the capacities corresponding to those of the blowers 24 and 25. In the experiments conducted by the inventor, electric precipitators with DC 5 KV and 2 A and the surface area of the electrode or electrodes of 4 m$^2$ were sometimes connected in series to the bag filters.

The present invention is not limited to the first and second embodiments and may be equally applied to an in-line type sputtering system in which no deposition drum is used. The objects can be attained with the dust collector of the type described with reference to FIG. 1 in the case of a sputtering system with four to eight targets each 50×15 cm in size. In the case of the in-line type, it is preferable to provide independent dust collection systems not only for a deposition chamber but also for other preparatory chambers (which are often provided in order to preheat and clean the film substrate and to maintain a desired pressure difference). The effects of the present invention can be attained to some extent by providing a plurality of blowers for one dust collector based on the economical standpoint or by providing one blower for one dust collector and adjusting the resistance of the closed circuit.

For the fabrication of magnetic tapes and disks or thin-film solar cells, it is optimum to provide one blower and one dust collector in a relatively closed space.

The fact that the system of the present invention is effective in the oblique-incidence vacuum evaporation or gas-atmospheric evaporation (the latter including sputtering) process is observed from the fact that evaporants which adhere to the interior structure are porous and tend to be of the fine-particle structure.

The system of the present invention will not control evaporant materials and is advantageous when applied to an apparatus for the deposition of selenium or the like which causes a pollution problem.

With the vacuum evaporation system as shown in FIG. 2, CoNi is deposited to the thickness of 1000 Å over polyethylene terephthalate substrate of the thickness of 10 μm after the dust collector 27 has been operated for 5, 10 and 15 minutes. The coated substrates are cut into strips of the width of ⅛" and dropout rates are measured. The rates are 1/1000, 1/1300 and 1/1350, respectively, as compared with the rate 1 of the tape which has a thin magnetic film deposited without operating the dust collector 27. The tape in accordance with the present invention has the coercive force of 1000 Oe and the squareness ratio of 0.89.

The magnetic disks (fabricated under similar conditions as described above) exhibit similar dropout rates. The thin-film solar cells also exhibit the leakage currents from 1/100 to 1/1000. These facts prove that the present invention is of great value. In the experiments the filter consisting of a mixture of glass wool and asbestos is used, but it is to be understood that any other suitable filters may be used.

What is claimed is:

1. A vacuum evaporation system for the deposition of thin films comprising:
   a blower and dust collector in communication through valve means with an evacuated process chamber in which are disposed at least one set of a film substrate holder and an evaporation source whereby the gases in the evacuated process chamber can be filtered while the vacuum is maintained.

2. A vacuum evaporation system for the deposition of thin films comprising:
   a blower and a dust collector in communication through valve means with an evacuated process chamber in which are disposed at least one set of a film substrate holder and an evaporation source in such a way that said blower, said dust collector and said evacuated process chamber comprise a closed circuit.

3. A vacuum evaporation system for the deposition of thin films as set forth in claim 1 or 2 further characterized in that
   said film substrate holder is a deposition drum which guides a tape-like substrate.

4. A vacuum evaporation system for the deposition of thin films as set forth in claim 3 further characterized in that
   said deposition drum is rotated in the direction opposite to the direction of the flow of air from said blower.

* * * * *